(12) United States Patent
Jaeger et al.

(10) Patent No.: US 11,056,398 B2
(45) Date of Patent: Jul. 6, 2021

(54) FORMING INTERCONNECT WITHOUT GATE CUT ISOLATION BLOCKING OPENING FORMATION

(71) Applicant: GLOBALFOUNDRIES U.S. Inc., Santa Clara, CA (US)

(72) Inventors: Daniel J. Jaeger, Saratoga Springs, NY (US); Naved A. Siddiqui, Sunnyvale, CA (US); Shimpei Yamaguchi, Ibaraki (JP); Shreesh Narasimha, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/517,827

(22) Filed: Jul. 22, 2019

(65) Prior Publication Data
US 2021/0028067 A1 Jan. 28, 2021

(51) Int. Cl.
| | |
|---|---|
| *H01L 21/8234* | (2006.01) |
| *H01L 21/768* | (2006.01) |
| *H01L 27/088* | (2006.01) |
| *H01L 29/66* | (2006.01) |
| *H01L 29/78* | (2006.01) |

(52) U.S. Cl.
CPC ........ *H01L 21/823475* (2013.01); *H01L 21/76814* (2013.01); *H01L 21/76829* (2013.01); *H01L 21/76877* (2013.01); *H01L 21/823431* (2013.01); *H01L 21/823462* (2013.01); *H01L 21/823481* (2013.01); *H01L 27/0886* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 9,064,932 B1 | 6/2015 | Pham et al. | |
| 9,679,985 B1 | 6/2017 | Wu et al. | |
| 9,991,361 B2 | 6/2018 | Dai et al. | |
| 10,229,854 B1* | 3/2019 | Sporre | H01L 27/0886 |
| 2016/0056181 A1 | 2/2016 | Anderson et al. | |
| 2017/0084723 A1 | 3/2017 | Greene et al. | |
| 2018/0069000 A1* | 3/2018 | Bergendahl | H01L 21/823468 |

\* cited by examiner

*Primary Examiner* — Robert K Carpenter
(74) *Attorney, Agent, or Firm* — Francois Pagette; Hoffman Warnick LLC

(57) ABSTRACT

A method includes forming a gate cut opening by removing a sacrificial material from a portion of a dummy gate in a first dielectric over a substrate. The gate cut opening includes a lower portion in which the sacrificial material was located and an upper portion extending laterally over the first dielectric. Filling the gate cut opening with a second dielectric creates a gate cut isolation. Recessing the second dielectric creates a cap opening in the second dielectric; and filling the cap opening with a third dielectric creates a dielectric cap. The third dielectric is different than the second dielectric, e.g., oxide versus nitride, allowing forming of an interconnect in at least a portion of the third dielectric without the second, harder dielectric acting as an etch stop.

12 Claims, 13 Drawing Sheets

FORMING INTERCONNECT WITHOUT GATE CUT ISOLATION BLOCKING OPENING FORMATION

BACKGROUND

The present disclosure relates to integrated circuit (IC) fabrication, and more specifically, to a method of replacing a dielectric from a gate cut isolation that blocks interconnect opening formation with another dielectric, and the resulting IC structure.

Fin-type field effect transistors (finFETs) are formed by creating a number of semiconductor fins on a substrate and placing a gate conductor perpendicularly across the fins. A finFET is created by the gate forming a channel region below the gate in the fin, and source/drain regions formed in the fin aside the gate. In order to form the various portions of the finFET according to replacement metal gate (RMG) approach, an elongated dummy gate is put in place where the metal gate conductor will eventually be placed perpendicularly across the fins. The dummy gate allows for processing such as anneals to be carried out without damaging the final gate conductor material. Spaces between the dummy gates and fins are filled with an interlayer dielectric. The dummy gates are typically made of polysilicon or amorphous silicon. As part of the process, a gate cut opening may be formed in part of a pair of dummy gates and filled with a gate cut fill, which is typically a nitride such as silicon nitride. To form the finFETs, the dummy gate is removed, and replaced with a metal gate conductor that extends over adjacent fins. The nitride fill remains in the metal gate conductor and creates a gate cut isolation that provides an electrical isolation between gates of adjacent finFETs.

The gate cut isolation may also be in a location in which interconnects such as source/drain (S/D) contacts and/or lateral interconnects (wires) are desired. These S/D contacts may run vertically to contact S/D regions in fins thereunder, and the lateral interconnects or wires may run laterally to provide connections for IC structures in the transistor (device) layers. Etching to form the gate cut opening in the pair of dummy gates may create a relatively wide recess at a top portion of the gate cut opening, i.e., by removing pillars of dielectric material between the dummy gates at a top thereof. When the gate cut nitride fill is formed it fills the dummy gates and the wide recess, creating a laterally extending nitride at a top portion of the gate cut isolation. Forming interconnects in advanced technology nodes (e.g., beyond 14 nanometers) in this location presents a challenge in that the planarization performed after nitride filling to form the gate cut isolation (e.g., chemical mechanical polishing and etch back) may not remove the laterally extending nitride at the top portion of the gate cut isolation. The laterally extending nitride acts as an etch stop layer that prevents interconnect opening formation in later processing. Removal of the laterally extending nitride, for example, using additional planarization from that normally provided, creates additional issues by reducing the height of adjacent gates.

SUMMARY

A first aspect of the disclosure is directed to a method, comprising: forming a gate cut opening by removing a sacrificial material from a portion of a dummy gate in a first dielectric over a substrate, the gate cut opening including a lower portion in which the sacrificial material was located and an upper portion extending laterally over the first dielectric; filling the gate cut opening with a second dielectric; recessing the second dielectric to create a cap opening in the second dielectric; filling the cap opening with a third dielectric; and forming an interconnect through the third dielectric.

A second aspect of the disclosure includes a method, comprising: forming a pair of gate cut openings in a first dielectric over a substrate; filling the pair of gate cut openings with a second dielectric; recessing the second dielectric to create a cap opening in the second dielectric; filling the cap opening with a third dielectric; forming an interconnect opening through the third dielectric; and forming an interconnect conductor in the interconnect opening.

A third aspect of the disclosure related to an integrated circuit (IC) structure, the IC structure comprising: a plurality of field effect transistors (FETs) over a substrate; a first dielectric electrically isolating the plurality of FETs; a gate cut isolation electrically isolating gates of a pair of the plurality of FETs, the gate cut isolation including a second dielectric; a dielectric cap extending laterally over an upper surface of at least a portion of the gate cut isolation, the dielectric cap including a third dielectric different than the second dielectric; and an interconnect extending laterally in contact with an upper portion of the gate cut isolation, the interconnect conductor contacting the dielectric cap.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
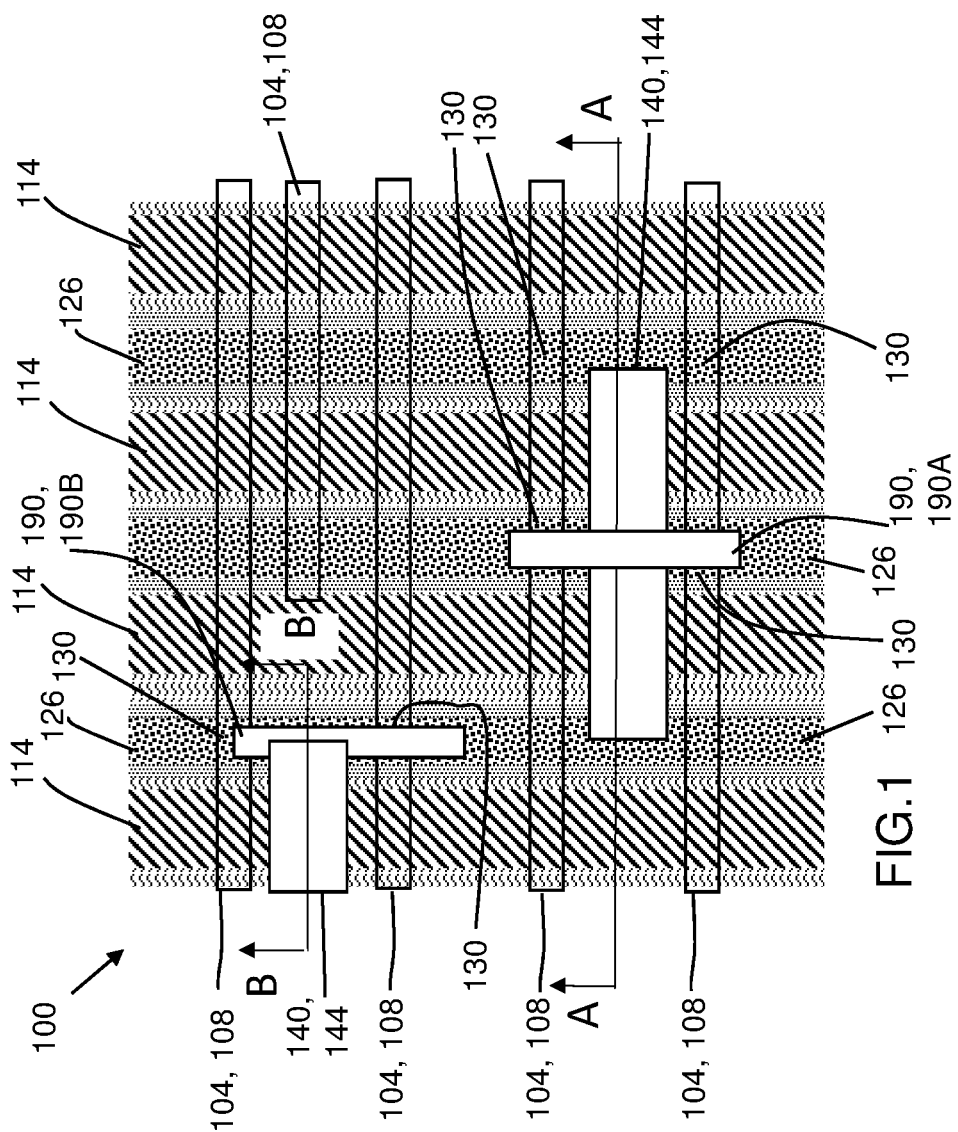
FIG. 1 shows a schematic plan view of a preliminary structure of an IC structure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods for forming an interconnect on and within a gate cut isolation. Among other things, embodiments of the disclosure eliminate the possibility of the gate cut isolation dielectric blocking subsequent interconnect opening formation, e.g., by etching. One embodiment includes forming a gate cut opening by removing a sacrificial material from a portion of a dummy gate in a dielectric, e.g., an inter-level dielectric (ILD), over a substrate. The gate cut opening includes a lower portion in which the sacrificial material was located and an upper portion extending laterally over the ILD. Filling the gate cut opening with another dielectric, e.g., a nitride, creates a gate cut isolation. Recessing the gate cut isolation dielectric creates a cap opening in the nitride; and filling the cap opening with another dielectric, e.g., oxide, creates a dielectric cap. The dielectric cap material is different than the gate cut isolation dielectric, e.g., oxide versus nitride. The different materials allow forming of an interconnect in at least a portion of the dielectric cap material without the harder gate cut isolation dielectric acting as an etch stop. That is, the oxide dielectric cap being made of a softer dielectric prevents the gate cut isolation nitride from acting a contact etch stop layer (CESL). Embodiments of the disclosure can be applied anywhere a gate cut isolation may block interconnect forming, i.e., contacts or lateral interconnect (wire) formation.

Figure 12:
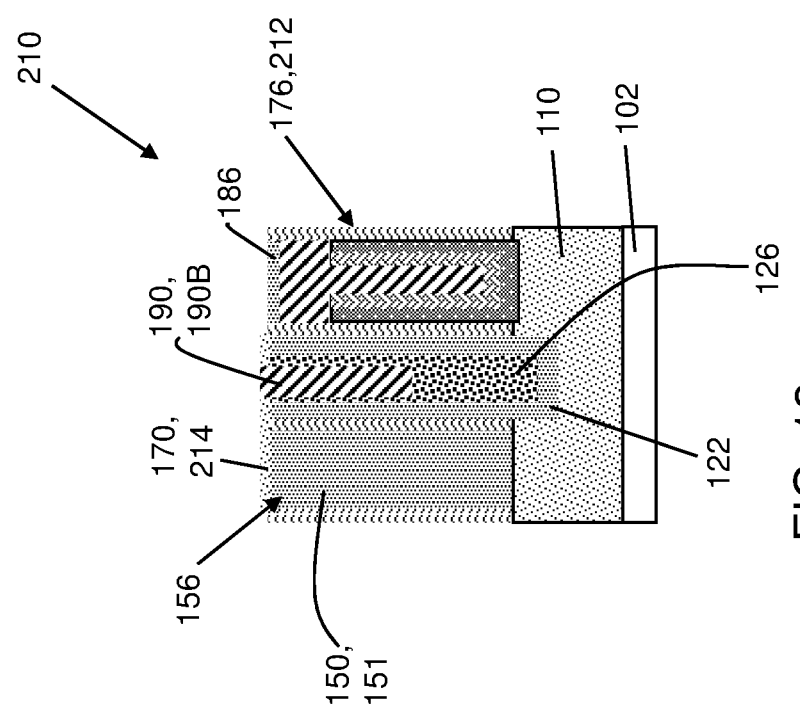
FIG. 12 shows a cross-sectional view along line B-B across a gate (or X) direction in another location than line A-A in FIG. 1 after a method forming an interconnect according to embodiments of the disclosure.
Figure 13:
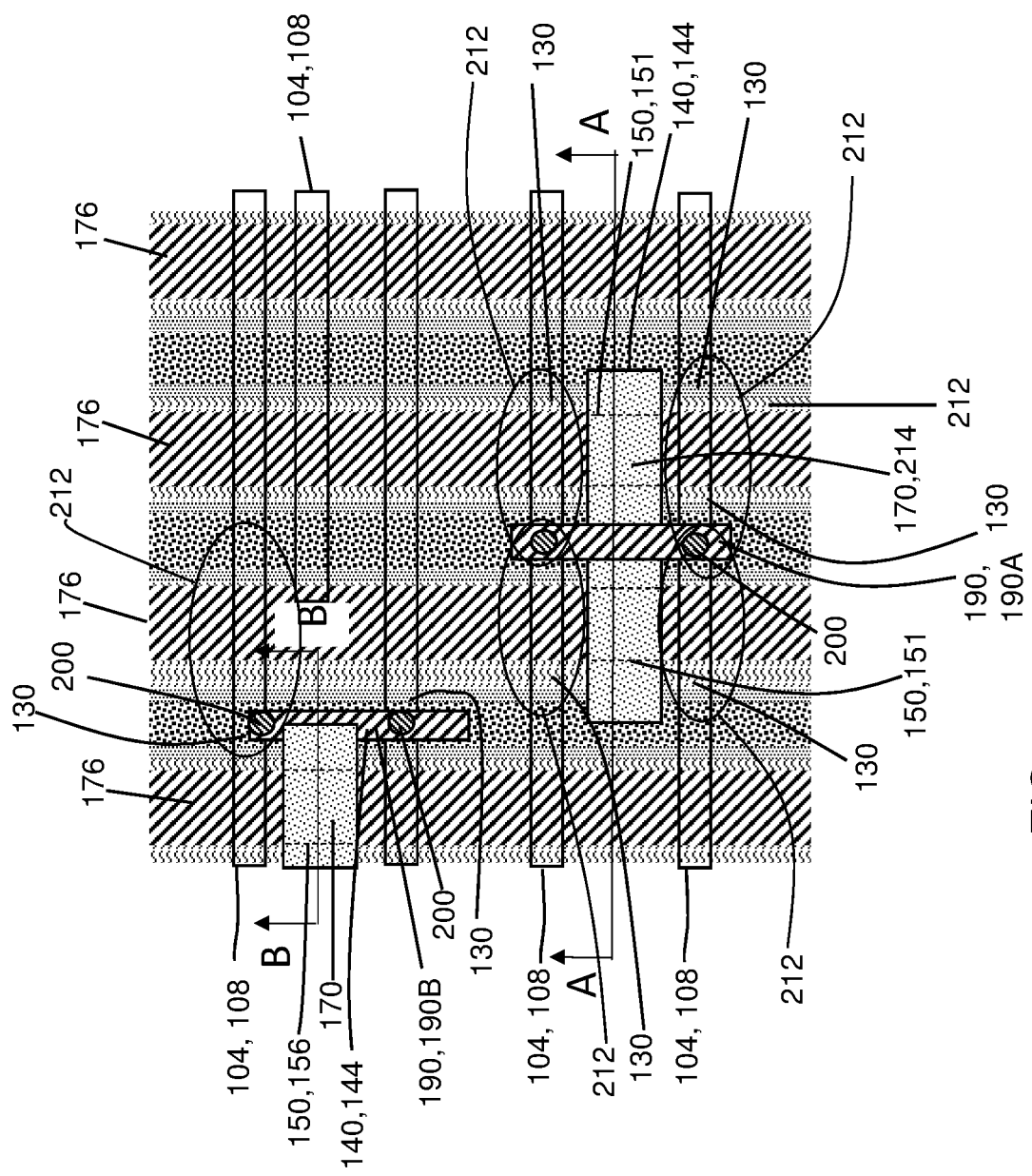
FIG. 13 shows a schematic plan view of an IC structure after a method of forming an interconnect according to embodiments of the disclosure.

FIG. 1 shows a schematic plan view of a preliminary structure 100 of an integrated circuit (IC) structure for purposes of description of the disclosure. FIGS. 2-11 show a cross-sectional view along line A-A across a gate (or X) direction in FIG. 1; and FIG. 12 shows a cross-sectional view along line B-B across a gate (or X) direction in another location than line A-A in FIG. 1. FIG. 13 shows a schematic plan view of an IC structure 210 after a method of forming an interconnect according to embodiments of the disclosure.

Figure 2:
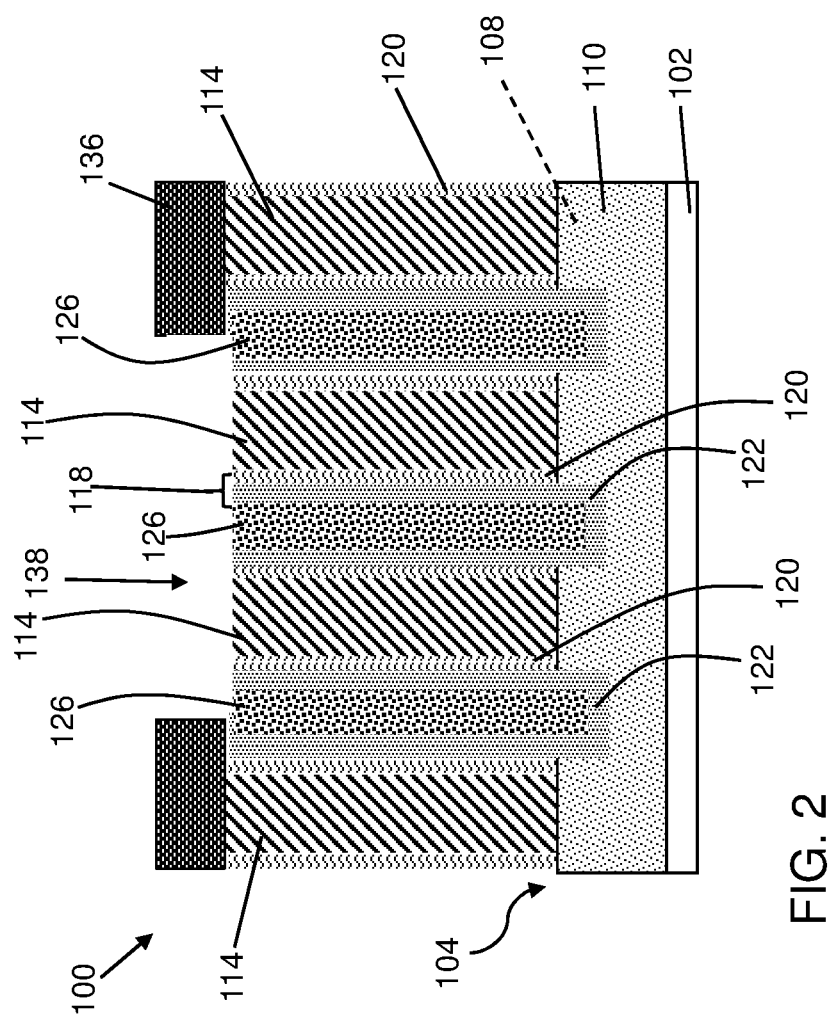
FIG. 2 shows a cross-sectional view along line A-A across a gate (or X) direction in FIG. 1 of the preliminary structure.

With reference to FIGS. 1 and 2, a preliminary structure 100 is illustrated. Preliminary structure 100 may include a substrate 102 having active regions 104, which are shown in the form of a plurality of semiconductor fins 108 in phantom in FIG. 1 (buried below other structure). However, while the disclosure is shown applied to a fin-type active region, it is emphasized that the teachings are applicable to any type active region including but not limited to planar or bulk, nanosheet, semiconductor-on-insulator, etc. Plurality of semiconductor fins 108 are shown in phantom in FIG. 1 and have been formed extending from substrate 102, i.e., they are buried under other structures in FIG. 1. Active regions 104 (e.g., semiconductor fins 108) and substrate 112 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. Semiconductor fins 108 may be formed in any now known or later manner, e.g., epitaxial growth from substrate 102.

As shown in FIG. 2, active regions 104 (e.g., semiconductor fins 108) may be electrically isolated from each other by a shallow isolation trench (STI) dielectric layer 110. (Note, semiconductor fins 108 are hidden behind STI dielectric layer 110 in FIGS. 2-12). STI dielectric layer 110 may include any now known or later developed STI material such as but not limited to an oxide. STI dielectric layer 110 electrically separates semiconductor fins 108. STI dielectric layer 110 may be formed using any appropriate deposition technique.

As used herein, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. STI dielectric layer 110 may be formed, for example, by CVD.

FIGS. 1 and 2 also show a dummy gate 114 formed over active regions 104, e.g., perpendicularly over semiconductor fins 108. Dummy gate 114 may include any now known or later developed sacrificial material used for dummy gates such as but not limited to polysilicon and amorphous silicon. As shown in FIGS. 1 and 2, spacer 118 may be provided along the sides of dummy gate 114. Spacer 118 may include any now known or later developed spacer material(s) such as but not limited to a low dielectric constant (low-K) spacer 120 and a contact etch stop layer (CESL) 122. CESL 122 may include, for example, silicon nitride ($Si_3N_4$), among other etch stop layer materials.

Preliminary structure 100 may also include source/drain (S/D) regions 130 formed in active regions 104, e.g., semiconductor fins 108, to each side of selected dummy gates 114. S/D regions may be formed by ion implantation of dopants, and/or S/D epitaxy, oxide deposition and polishing. Doping is the process of introducing impurities (dopants) into a semiconductor substrate, or elements formed on the semiconductor substrate, and is often performed with a mask (or previously-formed elements like the dummy gates in place) so that only certain areas of the active region, e.g., substrate/fins, will be doped. Epitaxy means the growth of a semiconductor material on a deposition surface of a semiconductor material, in which the semiconductor material being grown may have the same crystalline characteristics as the semiconductor material of the deposition surface.

Preliminary structure 100 may also include an interlayer dielectric (ILD) 126 electrically isolating active regions 104 (e.g., semiconductor fins 108 (behind STI dielectric layer 110 in FIG. 2)) and dummy gates 114. ILD 126 is shown between dummy gates 114 in FIG. 2. Suitable dielectric materials for ILD 126 may include but are not limited to: carbon-doped silicon dioxide materials; fluorinated silicate glass (FSG); organic polymeric thermoset materials; silicon oxycarbide; SiCOH dielectrics; fluorine doped silicon oxide;

spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5104 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). ILD 126 may be formed, for example, using a flowable CVD (FCVD) process for oxide, followed by a planarization to remove excess material. Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

While particular processes may have been described herein, it will be understood by those skilled in the art that preliminary structure 100 can be formed using any of a variety of other now known or later developed semiconductor fabrication techniques.

Figure 3:
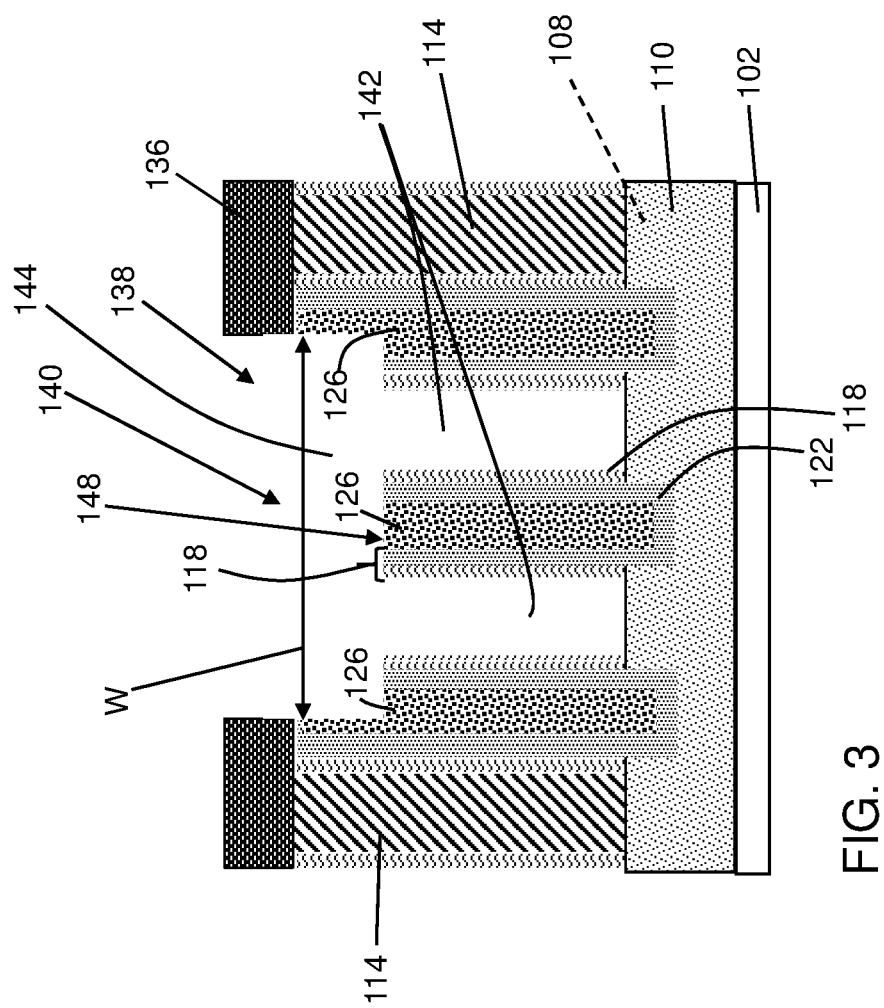
FIG. 3 shows a cross-sectional view of a gate cut opening according to embodiments of the disclosure.

FIGS. 2 and 3 show cross-sectional views of forming a gate cut opening 140 (FIG. 3) by removing a sacrificial material, e.g., amorphous silicon, from a portion of dummy gate 114 in ILD 126 over substrate 102, according to embodiments of the disclosure. As shown in FIG. 1, each dummy gate 114 may extend (perpendicularly) over active region(s) 104, e.g., plurality of spaced semiconductor fins 108. One or more dummy gates 114 may be cut by a respective gate cut opening 140. The removed portion(s) of each dummy gate 114 may be selected for segregating between distinct metal gates formed in subsequent processing. For example, gate cut opening 140 in line A-A in FIG. 1 cuts two dummy gates 114, and gate cut opening 140 in line B-B in FIG. 1 cuts just one dummy gate 114. A gate cut opening 140 may cut any number of gates. As observed in FIG. 1, each gate cut opening 140 is located over STI dielectric layer 110, i.e., not over active regions 104 like semiconductor fins 108. For example, gate cut opening 140 at line B-B includes a portion of dummy gate(s) 114 between active regions 104, and gate cut opening 140 at line A-A is in an area in which active regions 104 have been removed.

As shown in FIG. 2, gate cut opening(s) 140 may be formed by depositing, patterning and etching a hard mask 136, including an opening 138 therein. In one example, hard mask 136 may include a nitride hard mask material with an amorphous silicon hardmask under-layer (not shown). However, a wide variety of other hard mask materials are possible such as but not limited to: titanium oxide ($TiO_2$) or aluminum oxide ($Al_2O_3$). Gate cut opening 140 may be formed by any appropriate etching process. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as trenches. In this example, gate cut opening 140 may be formed, for example, by RIE.

As shown in FIG. 3, gate cut opening 140 may include a lower portion 142 in which only sacrificial material of dummy gate(s) 114 was located, and an upper portion 144 extending laterally above remaining portions of spacer 118 and ILD 126. In the FIGS. 2 and 3 embodiment, gate cut opening 140 (at line A-A in FIG. 1) is formed in a pair of dummy gates 114 separated by a pillar 148 of ILD 126 over substrate 102. That is, gate cut opening 140 formation includes etching to remove the sacrificial material from portions of pair of dummy gates 114 (two innermost in FIG. 2) separated by pillar 148 of ILD 126. In this fashion, a pair of lower portions 142 of gate cut openings 140 are formed in ILD 126 over substrate 102. Thus, gate cut opening 140 in this embodiment has a width W wider than a single dummy gate 114. As observed by comparing FIGS. 2 and 3, gate cut opening 140 formation may recess pillar 148 from its original height, i.e., the sacrificial material RIE gouges ILD 126 and spacer 118 films (low-k spacer 120 and CESL 122). Consequently, after etching, pillar 148 may not be at the same height as dummy gates 114 in FIG. 3 that are protected by mask 136. Adjacent portions of ILD 126 may also have non-uniform height after etching, as shown in the cross-section.

Figure 4:
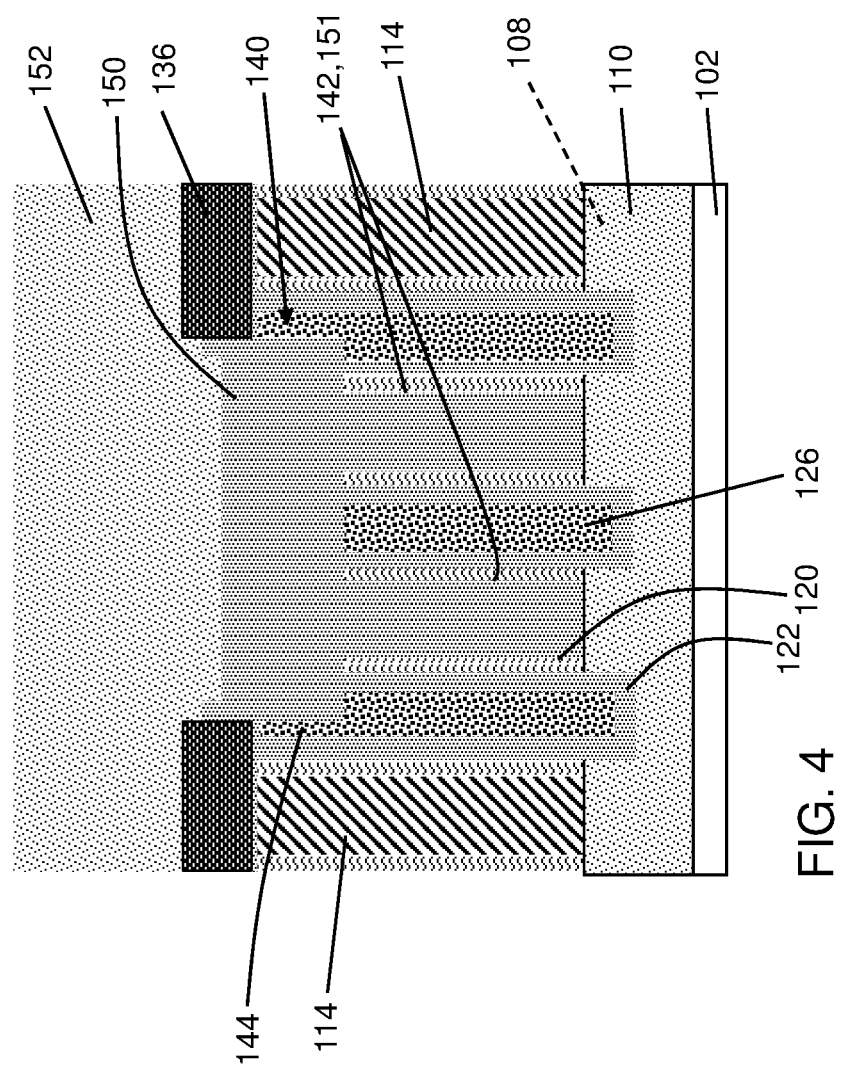
FIG. 4 shows a cross-sectional view of a filling a gate cut opening according to embodiments of the disclosure.
Figure 5:
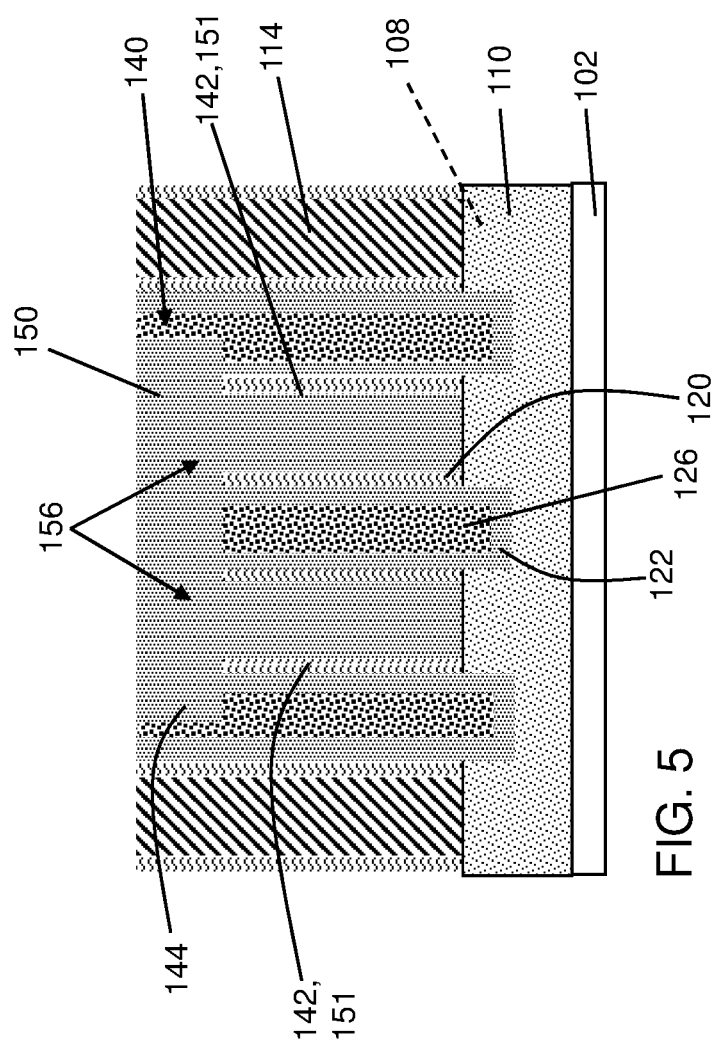
FIG. 5 shows a cross-sectional view of a planarization of the gate cut opening fill according to embodiments of the disclosure.

FIG. 4 shows a cross-sectional view of filling gate cut opening 140 with a dielectric 150. Dielectric 150 may include a gate cut isolation nitride such as silicon nitride ($Si_3N_4$), which acts to prevent critical dimension (CD) expansion in a Y direction, i.e., into and out of the page. Fill dielectric 150 may be deposited using, for example, CVD. As illustrated, dielectric 150 fills gate cut opening 140 including lower portions 142 and upper portion 144. A sacrificial oxide 152 may also be formed (e.g., as a HDPCVD oxide) to assist with subsequent planarization. FIG. 5 shows the structure after planarization, i.e., with sacrificial oxide 152 (FIG. 4) and mask 136 (FIG. 4) removed. Dielectric 150 creates a gate cut isolation 156 with a pair of spaced dielectric columns 151.

Figure 6:
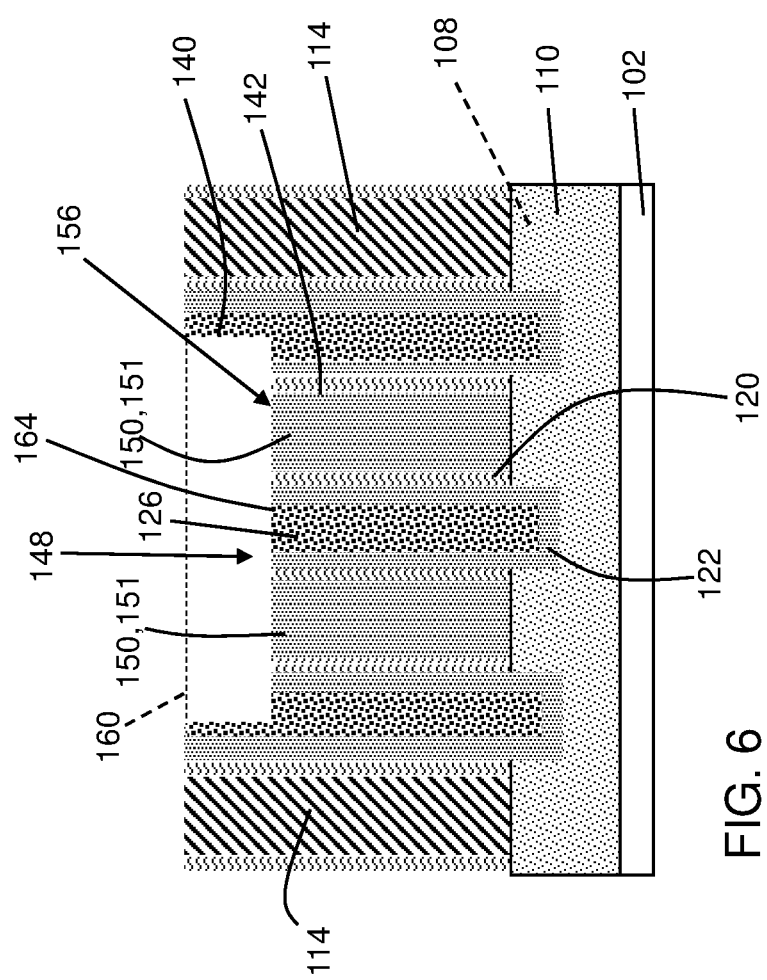
FIG. 6 shows a cross-sectional view of recessing a gate cut opening fill to create a cap opening according to embodiments of the disclosure.

FIG. 6 shows recessing dielectric 150 to create a cap opening 160 in dielectric 150. In a conventional process, much of dielectric 150 remains, creating a laterally extending nitride plug over dielectric 150 that acts as an etch stop layer during later interconnect formation. In contrast to conventional processes, the recessing is extended to recess dielectric 150 to create cap opening 160 to at least an upper surface 164 of pillar 148 of ILD 126. That is, recessing dielectric 150 creates cap opening 160 in upper portion 144 of gate cut opening 140 to upper surface 164 of pillar 148 of ILD 126. Gate cut isolation 156 dielectric columns 151 remain intact.

Figure 7:
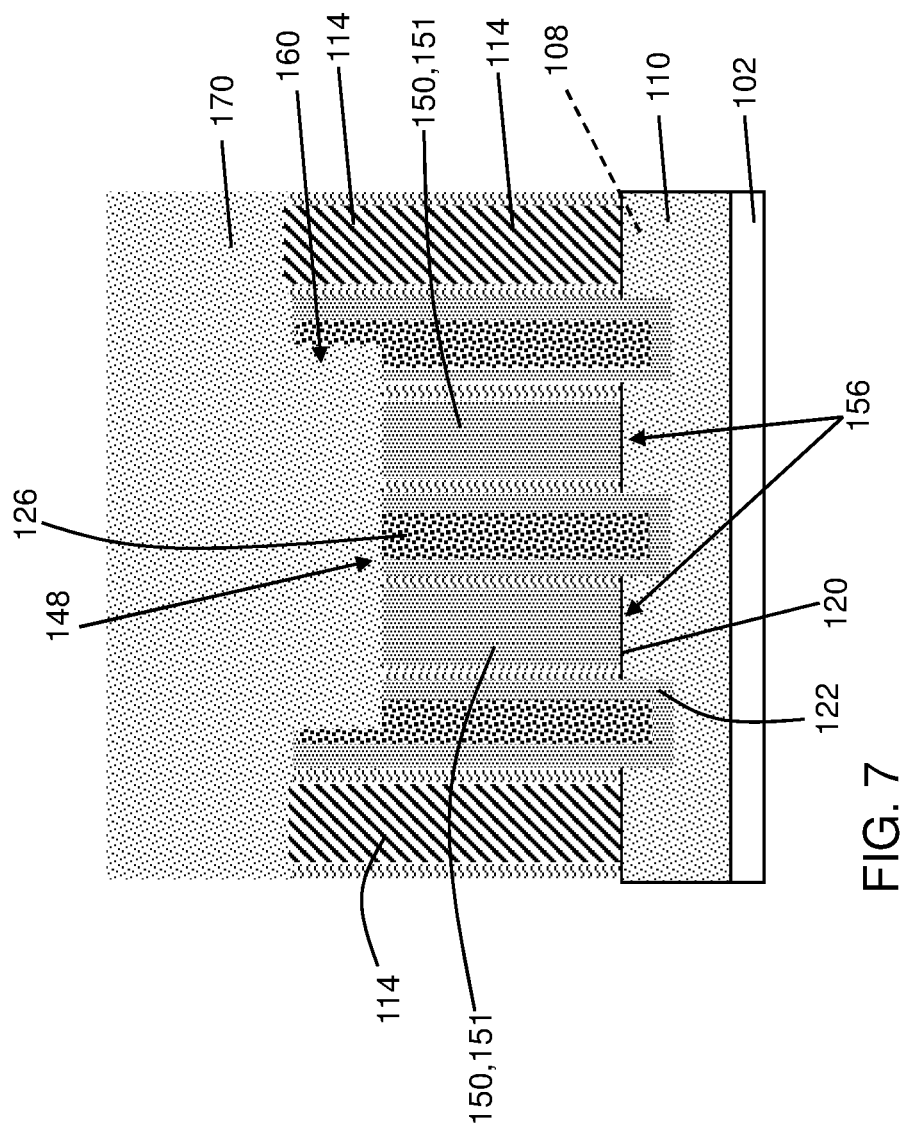
FIG. 7 shows a cross-sectional view of filling the cap opening according to embodiments of the disclosure.
Figure 8:
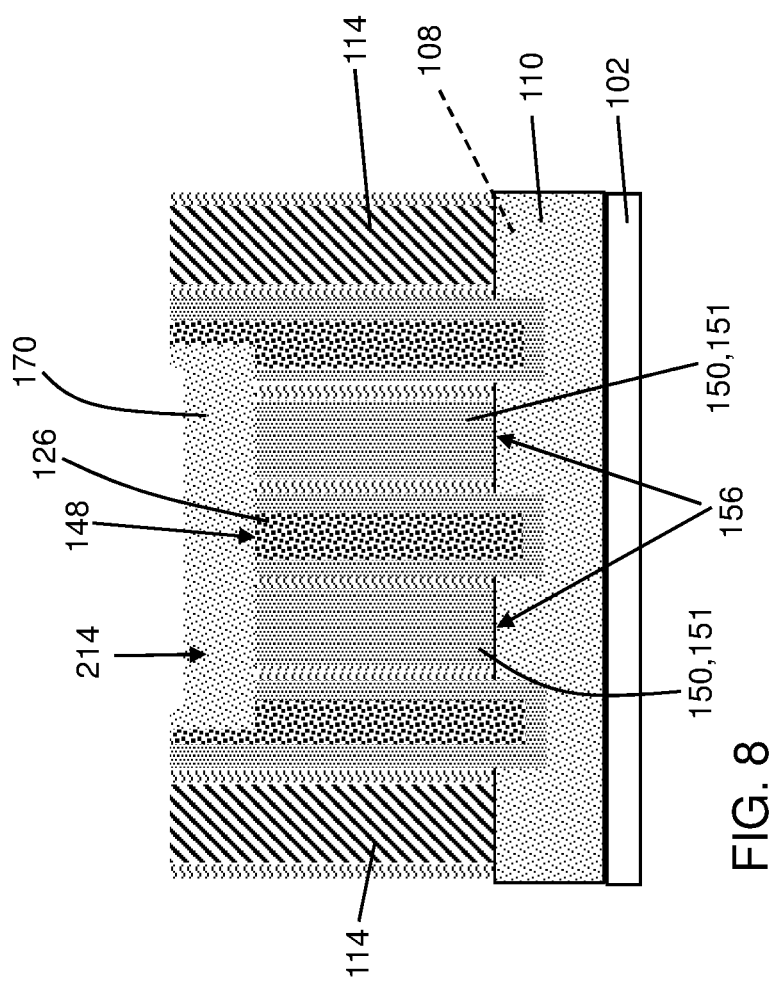
FIG. 8 shows a cross-sectional view of planarizing the cap opening fill according to embodiments of the disclosure.

FIG. 7 shows a cross-sectional view of filling cap opening 160 with a dielectric 170. Dielectric 170 may include any of a variety of higher density oxides. Filling cap opening 160 may include, for example, performing a HDPCVD of oxide. Consequently, dielectric ILD 126 and dielectric 170 may include a common material, e.g., oxide. An aspect ratio of dielectric 170 may be, for example, 1:1 to 2:1. FIG. 8 shows a cross-sectional view of planarizing dielectric 170, to finalize the filling process, creating a dielectric cap 214 over gate cut isolation 156. The planarizing may include, for example, CMP. As shown in FIG. 8, the oxide of dielectric 170 replaces a laterally extending nitride cap that would be present from not recessing the gate cut isolation nitride, i.e., dielectric 150, to the extent shown in FIG. 6. Dielectric cap 214 of dielectric 170 allows subsequent contact and interconnect formation that would normally be blocked by dielectric 150 acting as a CESL.

Figure 9:
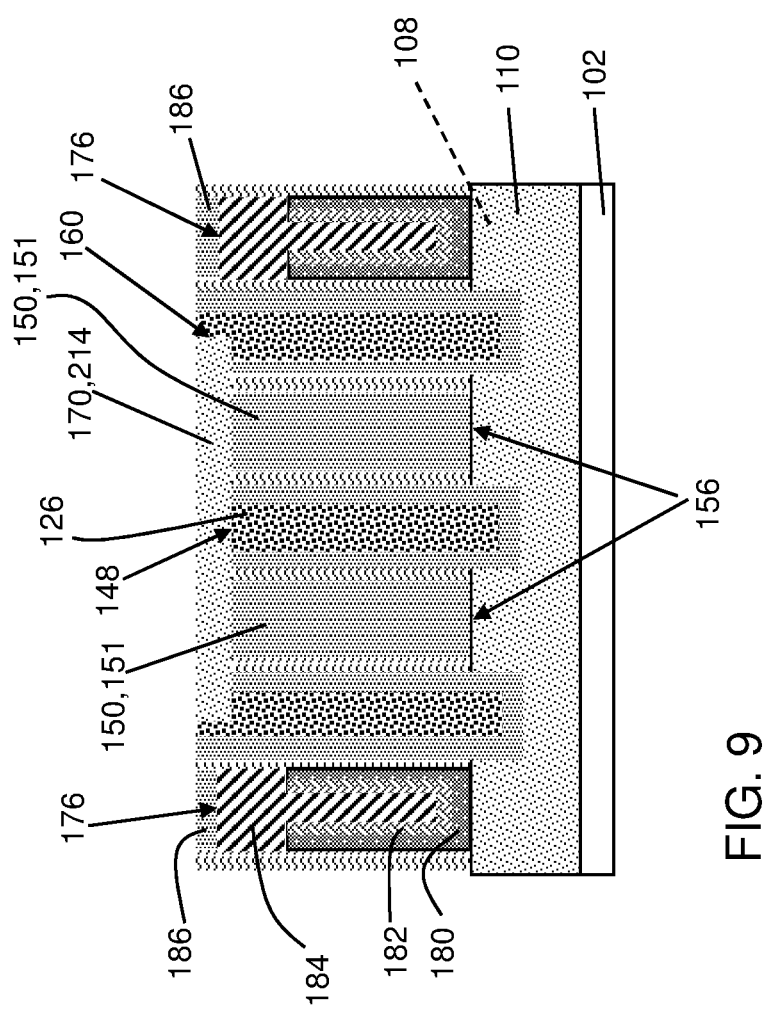
FIG. 9 shows a cross-sectional view after a replacement metal gate (RMG) process according to embodiments of the disclosure.

FIG. 9 shows a cross-sectional view of the structure after performing a replacement metal gate (RMG) process. The RMG process may include any now known or later developed RMG techniques. The RMG process may include, for example, replacing dummy gate(s) 114 over substrate 102 with metal gate(s) 176. As understood by those skilled in the art, the dummy gates are replaced to the sides of gate cut isolation 156, and behind and in front of gate cut isolation 156. In the latter case, those dummy gates 114 that are segregated by gate cut isolation 156 are also replaced with a metal gate 176. With reference to FIG. 13, which shows a schematic plan view of an IC structure 210 according to embodiments of the disclosure, gate cut isolations 156 create FETs 212 to either side of gate cut isolation 156. As observed by comparing FIGS. 1 and 13, the locations of metal gates 176 would match that of dummy gates 114. Dielectric columns 151 of gate cut isolations 156 in metal gates 176 are shown in phantom under dielectric cap 214 in FIG. 13.

The RMG process may start with a step commonly called "dummy gate pull." Dummy gate(s) 114 may be removed using any now known or later developed process. In one example, dummy gate 114 is etched away. In this case, dummy gates 114 may be removed, for example, by RIE. It is understood that dummy gate 114 removal leaves trenches in ILD 126 on opposing sides of dielectric 150, which are filled with metal gates 176. Metal gates 176 may include one or more conductive components for providing a gate terminal of a transistor. Metal gates 176 may include a high dielectric constant (high-K) layer 180, a work function metal layer 182 and a gate conductor 184. High-K layer 180 may include any now known or later developed high-K material typically used for metal gates 176 such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Work function metal layer 182 may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Gate conductor 184 may include any now known or later developed gate conductor such as copper (Cu). A planarization may be performed after gate conductor 184 deposition. A gate cap 186 of, for example, a nitride may also be formed over each metal gate 176, e.g., by gate conductor 184 recessing, deposition of nitride and planarization. As shown in FIG. 9, depending on the amount of planarization performed after gate conductor 184 deposition and gate cap 186 deposition, and with the understanding that metal gate 176 height must meet targets, a desired amount of dielectric cap 214, i.e., dielectric 170, may remain in cap opening 160 over gate cut isolation 156. The oxide of dielectric 170 thus replaces a laterally extending nitride cap that could act as a CESL during subsequent contact and interconnect formation.

Figure 10:
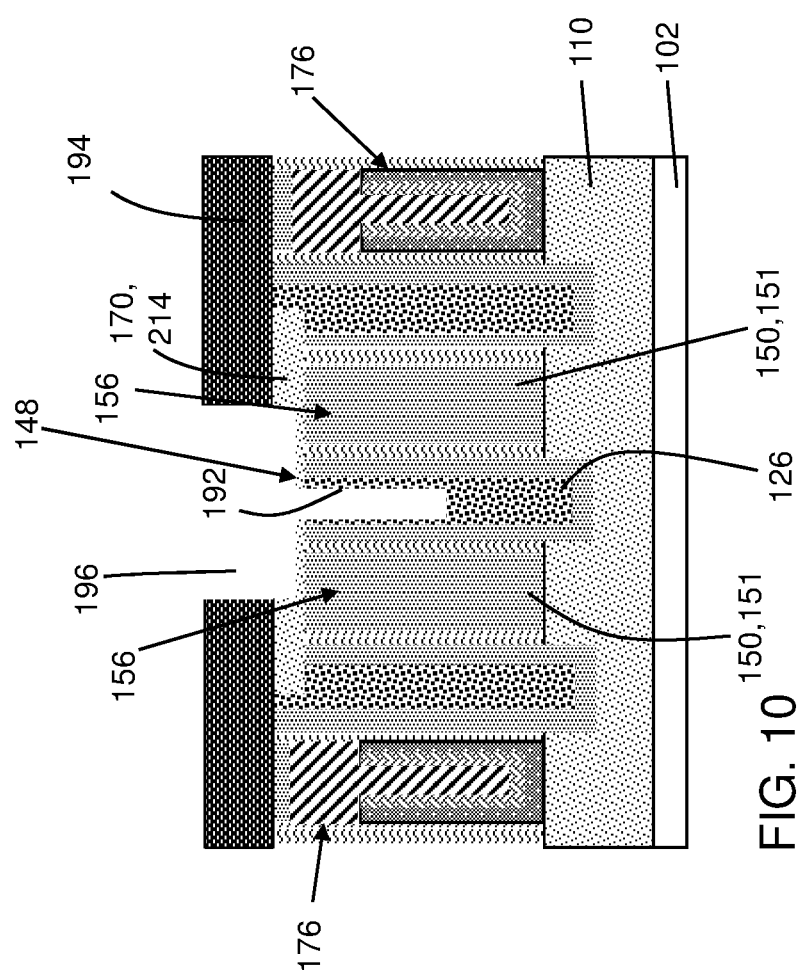
FIG. 10 shows a cross-sectional view of forming an interconnect opening according to embodiments of the disclosure.
Figure 11:
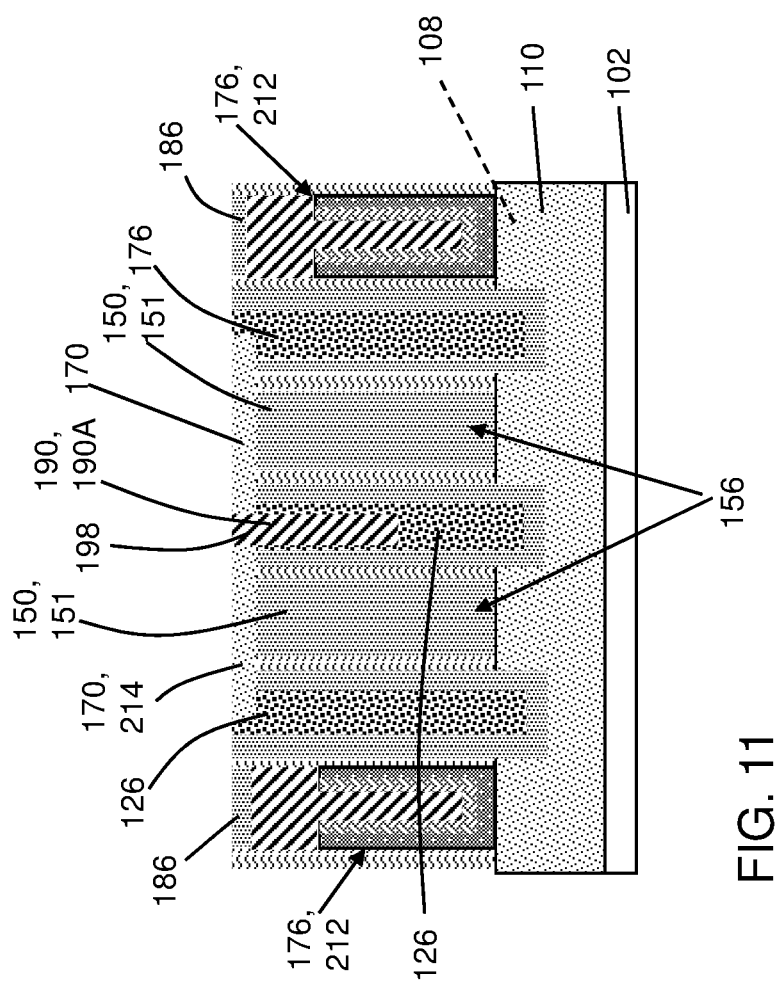
FIG. 11 shows a cross-sectional view of forming an interconnect according to embodiments of the disclosure.

FIGS. 10 and 11 show cross-sectional views of forming an interconnect 190 through dielectric 170, e.g., through dielectric cap 214 over gate cut isolation 156. FIG. 10 shows forming an interconnect opening 192 through dielectric 170, i.e., into pillar 148 of ILD 126 between portions of gate cut isolation 156. Interconnect opening 192 may be formed by depositing, patterning and etching a hard mask 194, including an opening 196 therein. In one example, hard mask 194 may include nitride hard mask with an amorphous silicon hardmask under-layer (not shown). However, a wide variety of other hard mask materials are possible such as but not limited to: titanium oxide ($TiO_2$) or aluminum oxide ($Al_2O_3$). Interconnect opening 192 may be formed by any appropriate etching process, e.g., a RIE. As shown in FIG. 13 relative to interconnect 190A and in the cross-section of FIG. 10, where gate cut isolation 156 is formed from a pair of dummy gates, interconnect opening 192 may extend through dielectric cap 214 and in a longitudinal relation relative to ILD 126 (pillar 148) between dielectric columns 151 of gate cut isolation 156. Here, interconnect opening 192 extends within gate cut isolation 156.

FIG. 11 shows interconnect 190A after interconnect conductor 198 deposition and planarization, leaving at least a portion of dielectric cap 214 (dielectric 170) laterally adjacent interconnect 190, i.e., at an upper end thereof. Interconnect 190A is formed in pillar 148 of ILD 126 between dielectric columns 151 of gate cut isolation 156. Interconnect 190A is electrically isolated from substrate 102 by at least ILD 126 thereunder. Interconnect conductor 198 may include any now known or later developed interconnect conductive material such as a refractory metal liner (not shown) and a conductor body therein of, for example, copper, aluminum, tungsten. Interconnect conductor 198 may be deposited, for example, using ALD. As shown in FIG. 13, interconnect 190A may also be formed with contacts 200 at ends thereof to, e.g., S/D regions 130 in semiconductor fins 108.

With reference to interconnect 190B in FIGS. 12 and 13 (at line B-B), in contrast to interconnect 190A, a lateral extent of a gate cut isolation 156 may only abut with a portion of an interconnect. The methodology as described herein for forming this structures is the same except, as shown by cross-section line B-B in FIG. 13, gate cut isolation 156 is formed in a single dummy gate 114 (leftmost in FIG. 13), rather than a pair as shown by cross-section line A-A in FIG. 13. Hence, gate cut isolation 156 has only one dielectric column 151. Consequently, ILD 126 and interconnect 190B are just beside one dielectric column 151 of gate cut isolation 156 instead of between dielectric columns 151. Dielectric cap 214 (dielectric 170) contacts an upper end of interconnect 190.

FIGS. 11 and 12 also show cross-sectional views of an IC structure 210 according to embodiments of the disclosure, and FIG. 13 shows a schematic plan view of each embodiment (FIG. 11 along line A-A and FIG. 12 along line B-B). As shown in FIG. 13, IC structure 210 includes a plurality of FETs 212 over substrate 102. Each FET 212 includes a metal gate 176 forming channel regions in semiconductor fins 108 (behind STI 110 in FIGS. 11 and 12) with S/D regions 130 (FIG. 13) in semiconductor fins 108 to sides of metal gates 176. As shown in FIGS. 11 and 12, IC structure 210 also includes ILD 126 electrically isolating FETs 212. A gate cut isolation 156 electrically isolates metal gates 176 of a pair of FETs 212 (vertically on either side of gate cut isolation 156 in FIG. 13). As described, gate cut isolation 156 includes dielectric 150, such as nitride. IC structure 210 also includes dielectric cap 214 extending laterally over an upper surface of at least a portion of gate cut isolation 156. Dielectric cap 214 includes an oxide, not a nitride as in gate cut isolation 156. Hence, ILD 126 and dielectric cap 214 include a common material, e.g., an oxide, while gate cut isolation 156 includes a nitride. IC structure 210 also includes interconnect 190 extending laterally (not vertically like a contact) in contact with an upper portion of gate cut isolation 156. Each interconnect 190 also contacts dielectric cap 214. Interconnect 190 is electrically isolated from substrate 102 by at least ILD 126. In FIG. 11, interconnect 190A may be embedded within upper portion of gate cut isolation 156 so that gate cut isolation 156 extends laterally in contact with both sides of interconnect 190. In contrast in FIG. 12, interconnect 190B may contact one side of gate cut isolation 156 so that gate cut isolation 156 extends laterally in contact with one side of interconnect 190.

Embodiments of the disclosure reduce the impact of a laterally extending nitride of gate cut isolation that acts as an etch stop layer and prevents interconnect opening formation in later processing. In addition, use of the dielectric cap of oxide does not require additional planarization that would impact the height of adjacent gates.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
    forming a gate cut opening by removing a sacrificial material from a portion of a dummy gate in a first dielectric over a substrate, the gate cut opening including a lower portion in which the sacrificial material was located and an upper portion extending laterally over the first dielectric;
    filling the gate cut opening with a second dielectric;
    recessing the second dielectric to create a cap opening in the second dielectric;
    filling the cap opening with a third dielectric; and
    forming an interconnect through the third dielectric, wherein the first dielectric and the third dielectric include a common material, and wherein the first dielectric includes a flowable chemical vapor deposited (FCVD) oxide, the second dielectric includes a nitride, and filling the cap opening with the third dielectric includes performing a high density plasma chemical vapor deposition (HDPCVD) of oxide.

2. The method of claim 1, wherein recessing the second dielectric to create the cap opening includes recessing the second dielectric in the upper portion of the gate cut opening to an upper surface of the first dielectric.

3. The method of claim 1, wherein forming the gate cut opening in the first dielectric over the substrate includes etching to remove the sacrificial material from portions of a pair of dummy gates separated by a pillar of the first dielectric, and recessing the second dielectric to create the cap opening includes recessing the second dielectric in the upper portion of the gate cut opening to at least an upper surface of the pillar of the first dielectric.

4. The method of claim 3, wherein filling the gate cut opening with the second dielectric fills the portions of the pair of dummy gates, creating a gate cut isolation; and wherein forming the interconnect includes forming the interconnect in the pillar of the first dielectric between portions of the gate cut isolation, the interconnect electrically isolated from the substrate by at least the first dielectric.

5. The method of claim 1, further comprising planarizing the third dielectric.

6. The method of claim 1, further comprising replacing the dummy gate over the substrate with a metal gate, wherein the gate cut opening filled with the second dielectric forms a gate cut isolation in the metal gate.

7. The method of claim 1, wherein forming the interconnect includes planarizing an interconnect conductor in an interconnect opening, leaving at least a portion of the third dielectric laterally adjacent the interconnect.

8. A method, comprising:
forming a pair of gate cut openings in a first dielectric over a substrate;
filling the pair of gate cut openings with a second dielectric;
recessing the second dielectric to create a cap opening in the second dielectric;
filling the cap opening with a third dielectric;
forming an interconnect opening through the third dielectric; and
forming an interconnect conductor in the interconnect opening,
wherein the first dielectric includes a flowable chemical vapor deposited (FCVD) oxide, the second dielectric includes a nitride, and filling the cap opening with the third dielectric includes performing a high density plasma chemical vapor deposition (HDPCVD) of oxide.

9. The method of claim 8, wherein forming the pair of gate cut openings in the first dielectric over the substrate includes etching to remove a sacrificial material from a pair of dummy gates separated by a pillar of the first dielectric, and recessing the second dielectric to create the cap opening includes recessing the second dielectric to at least an upper surface of the pillar of the first dielectric.

10. The method of claim 8, further comprising replacing dummy gates over the substrate with a metal gate, wherein the pair of gate cut openings filled with the second dielectric form a gate cut isolation in the metal gate.

11. The method of claim 8, further comprising planarizing the interconnect conductor in the interconnect opening, leaving at least a portion of the third dielectric laterally adjacent the interconnect conductor.

12. The method of claim 8, wherein where the interconnect conductor is within the gate cut isolation, the interconnect conductor is electrically isolated from a semiconductor fin in the substrate by at least the first dielectric.

* * * * *